(12) United States Patent
Ihara et al.

(10) Patent No.: US 12,550,659 B2
(45) Date of Patent: Feb. 10, 2026

(54) SUBSTRATE PROCESSING APPARATUS AND SUBSTRATE PROCESSING METHOD

(71) Applicant: Tokyo Electron Limited, Tokyo (JP)

(72) Inventors: Toru Ihara, Koshi (JP); Satoru Tanaka, Koshi (JP); Gentaro Goshi, Koshi (JP); Masami Yamashita, Koshi (JP); Reijiro Yamanaka, Tokyo (JP); Hideaki Kumashiro, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 973 days.

(21) Appl. No.: 17/507,975

(22) Filed: Oct. 22, 2021

(65) Prior Publication Data

US 2022/0130690 A1   Apr. 28, 2022

(30) Foreign Application Priority Data

Oct. 23, 2020   (JP) .................................. 2020-178315

(51) Int. Cl.
  *H01L 21/67*   (2006.01)
(52) U.S. Cl.
  CPC .............................. *H01L 21/67034* (2013.01)
(58) Field of Classification Search
  CPC ......... H01L 21/67034; H01L 21/67017; H01L 21/02101; F26B 5/005
  See application file for complete search history.

(56) References Cited

U.S. PATENT DOCUMENTS

2018/0138035 A1*   5/2018   Ohno ................. H01L 21/67051
2021/0104418 A1*   4/2021   Park ................... H01L 21/67017

FOREIGN PATENT DOCUMENTS

| JP | S63-069227 A | | 3/1988 |
| JP | 2003-510801 A | | 3/2003 |
| JP | 2007234862 A | * | 9/2007 |
| JP | 2018-074103 A | | 5/2018 |
| JP | 2019-201201 A | | 11/2019 |
| JP | 2020-126974 A | | 8/2020 |
| WO | 01/22016 A1 | | 3/2001 |

OTHER PUBLICATIONS

Translation, JP-2007234862-A (Year: 2007).*

* cited by examiner

*Primary Examiner* — Jessica Yuen
(74) *Attorney, Agent, or Firm* — Chrisman Gallo Tochtrop LLC

(57) ABSTRACT

A substrate processing apparatus configured to dry a substrate with a processing fluid in a supercritical state includes: a processing vessel; a substrate holder configured to hold the substrate horizontally within the processing vessel; a first supply line connected to a first fluid supply provided at the processing vessel and configured to supply the processing fluid into the processing vessel; a drain line connected to a drain unit provided at the processing vessel and configured to drain the processing fluid from the processing vessel; a bypass line branched off from the first supply line and connected to the drain line, the bypass line being configured to allow at least a part of the processing fluid flowing in the first supply line to be drained into the drain line without passing through the processing vessel; and a bypass opening/closing valve configured to open or close the bypass line.

12 Claims, 7 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-178315 filed on Oct. 23, 2020, the entire disclosure of which is incorporated herein by reference.

TECHNICAL FIELD

The various aspects and embodiments described herein pertain generally to a substrate processing apparatus and a substrate processing method.

BACKGROUND

In the manufacture of a semiconductor device in which a stacked structure of integrated circuits is formed on a surface of a substrate such as a semiconductor wafer (hereinafter, simply referred to as a wafer), a liquid processing such as chemical liquid cleaning or wet etching is performed. In order to more securely suppress a collapse of a pattern, which is getting more and more miniaturized in recent years, a drying method using a processing fluid in a supercritical state has been recently performed in a drying process, which is a final stage of the liquid processing.

Patent Document 1: Japanese Patent Laid-open Publication No. 2018-074103

SUMMARY

In one exemplary embodiment, a substrate processing apparatus configured to dry a substrate, which has a liquid on a surface thereof, with a processing fluid in a supercritical state includes: a processing vessel configured to accommodate the substrate therein; a substrate holder configured to hold the substrate horizontally within the processing vessel such that the surface of the substrate faces upwards; a first supply line connected to a first fluid supply provided at the processing vessel and configured to supply the processing fluid into the processing vessel; a drain line connected to a drain unit provided at the processing vessel and configured to drain the processing fluid from the processing vessel; a bypass line branched off from the first supply line at a first branch point set on the first supply line and connected to the drain line at a connection point set on the drain line, the bypass line being configured to allow at least a part of the processing fluid flowing in the first supply line to be drained into the drain line without passing through the processing vessel; and a bypass opening/closing valve configured to open or close the bypass line.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
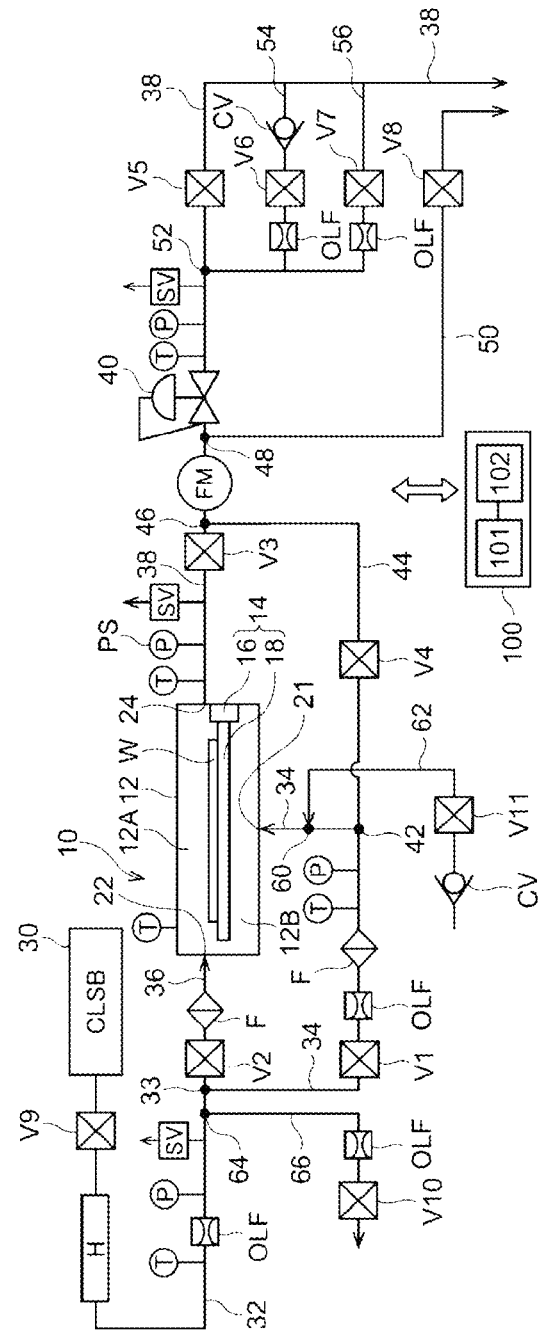
FIG. 1 is a pipeline system diagram illustrating a configuration of a supercritical processing apparatus as an example of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A supercritical processing apparatus as an example of a substrate processing apparatus will be described with reference to the accompanying drawings. This supercritical processing apparatus may be used to perform a supercritical drying processing of drying a substrate having a liquid (e.g., IPA) on a surface thereof by using a processing liquid in a supercritical state.

As depicted in FIG. 1, the supercritical processing apparatus is equipped with a processing unit 10 in which the supercritical drying processing is performed. The processing unit 10 includes a processing vessel 12 and a substrate holding tray 14 (hereinafter, simply referred to as "tray 14") configured to hold the substrate within the processing vessel 12.

In the exemplary embodiment, the tray 14 includes a cover 16 configured to close an opening provided in a sidewall of the processing vessel 12; and a substrate supporting plate (substrate holder) 18 (hereinafter, simply referred to as "plate 18") connected to the cover 16 to extend horizontally. A substrate W is placed on the plate 18 horizontally with a front surface (device formation surface) thereof facing upwards. The plate 18 is of, for example, a rectangular or square shape. An area of the plate 18 is larger than that of the substrate W. When the substrate W is placed at a preset position on the plate 18, the substrate W is completely covered with the plate 18 when the plate 18 is viewed from directly below it.

The tray 14 is configured to be moved horizontally between a processing position (closing position) and a substrate transfer position (opening position) by a tray moving mechanism (not shown). At the processing position, the plate 18 is located in an internal space of the processing vessel 12, and the cover 16 closes the opening of the sidewall of the processing vessel 12 (this state is shown in FIG. 1). At the substrate transfer position, the plate 18 is located outside the processing vessel 12, so that the substrate W can be transferred between the plate 18 and a non-illustrated substrate transfer arm. A moving direction of the tray 14 is, for example, a left-right direction of FIG. 1. Alternatively, the moving direction of the tray 14 may be a direction perpendicular to the paper plane of FIG. 1, and in this case, the cover 16 may be provided behind or in front of the plate 18.

When the tray 14 is placed at the processing position, the internal space of the processing vessel 12 is divided into an upper space 12A above the plate 18, where the substrate W is present during a processing; and a lower space 12B below the plate 18. However, the upper space 12A and the lower space 12B are not completely separated. A gap is formed between an edge of the tray 14 located at the processing position and an inner wall surface of the processing vessel 12 to serve as a communication path through which the upper space 12A and the lower space 12B communicate with each other. Further, the plate 18 may be provided with, near the cover 16, a through hole through which the upper space 12A and the lower space 12B communicate with each other.

As described above, if the internal space of the processing vessel 12 is divided into the upper space 12A and the lower space 12B, and, also, if there is provided the communication path through which the upper space 12A and the lower space 12B are allowed to communicate with each other, the tray 14 (plate 18) may be configured as a substrate placing table (substrate holder) fixed so as not to be movable in the processing vessel 12. In this case, in the state that a non-illustrated cover provided at the processing vessel 12 is opened, the non-illustrated substrate transfer arm advances into a vessel main body, and the substrate is transferred between the substrate placing table and the corresponding substrate transfer arm.

The processing vessel 12 is equipped with a first fluid supply 21 and a second fluid supply 22 configured to supply a pressurized processing fluid, for example, carbon dioxide (hereinafter, also referred to as "$CO_2$" for the purpose of simplicity) in a supercritical state in the present exemplary embodiment into the internal space of the processing vessel 12.

The first fluid supply 21 is provided below the plate 18 of the tray 14 placed at the processing position. The first fluid supply 21 supplies the $CO_2$ into the lower space 12B toward a bottom surface of the plate 18. The first fluid supply 21 may be implemented by a through hole formed in a bottom wall of the processing vessel 12. Also, the first fluid supply 21 may be a nozzle mounted to the bottom wall of the processing vessel 12.

The second fluid supply 22 is provided so as to be located at the side of the substrate W placed on the plate 18 of the tray 14 which is located at the processing position. The second fluid supply 22 may be provided, for example, at one sidewall (first sidewall) of the processing vessel 12 or in the vicinity thereof. The second fluid supply 22 supplies the $CO_2$ into the upper space 12A toward a region slightly above the substrate W.

The second fluid supply 22 may be implemented by a plurality of discharge openings arranged horizontally (for example, in the direction corresponding to the paper plane of FIG. 1). More specifically, the second fluid supply 22 may be implemented by a header formed of a pipe-shaped member extending horizontally and provided with a plurality of holes. It is desirable that the second fluid supply 22 is configured to flow the $CO_2$ into the region above the substrate W along a top surface (front surface) of the substrate W almost uniformly over the entire diameter of the substrate W.

The processing vessel 12 further includes a fluid drain unit 24 configured to drain the processing fluid from the internal space of the processing vessel 12. The fluid drain unit 24 may be provided as a header made of a pipe-shaped member extending horizontally and provided with a plurality of holes, the same as the second fluid supply 22. The fluid drain unit 24 may be provided at or near, for example, a sidewall (second sidewall) of the processing vessel 12 opposite to the first sidewall where the second fluid supply 22 is provided.

The fluid drain unit 24 may be disposed at any position as long as the $CO_2$ supplied into the processing vessel 12 from the second fluid supply 22 can be drained through the fluid drain unit 24 after passing through the region above the substrate W placed on the plate 18. For example, the fluid drain unit 24 may be provided at the bottom wall of the processing vessel 12 near the second sidewall. In such a configuration, after passing through the region above the substrate W within the upper space 12A, the $CO_2$ passes through the communication path provided near the edge of the plate 18 (or the through hole formed at the plate 18) into the lower space 12B, and is then drained from the fluid drain unit 24.

Now, a supply/drain system for supplying and draining the $CO_2$ into/from the processing vessel 12 in the supercritical processing apparatus will be described. In the pipeline system diagram shown in FIG. 1, a member indicated by an encircled T is a temperature sensor, and a member indicated by an encircled P is a pressure sensor. A member assigned with a notation OLF is an orifice (fixed throttle), and it serves to reduce a pressure of the $CO_2$ flowing in a pipeline downstream thereof to a required value. A member indicated by SV surrounded by a square is a safety valve (relief valve), which suppresses a damage on a constituent component of the supercritical processing apparatus such as a pipeline or the processing vessel 12 due to an unpredictable excessive pressure. A member designated by a notation F is a filter, and it serves to remove a contaminant such as a particle included in the $CO_2$. A member assigned with a notation CV is a check valve. A member indicated by an encircled FV is a flowmeter. A member denoted by H surrounded by a square is a heater configured to adjust a temperature of the $CO_2$. A member assigned with a notation VN (N is a natural number) is an opening/closing valve, and ten opening/closing valves V1 to V10 are illustrated in FIG. 1.

The supercritical processing apparatus has a supercritical fluid supply device 30. In the present exemplary embodiment, a supercritical fluid is carbon dioxide in a supercritical state (hereinafter, also referred to as "supercritical $CO_2$"). The supercritical fluid supply device 30 has a commonly-known configuration including, for example, a carbon dioxide gas cylinder, a booster pump, a heater, and the like. The supercritical fluid supply device 30 can send the supercritical $CO_2$ at a pressure equal to or higher than a supercritical state proof pressure (specifically, about 16 MPa) to be described later.

A main supply line 32 is connected to the supercritical fluid supply device 30. The $CO_2$ in the supercritical state flows out from the supercritical fluid supply device 30 into the main supply line 32, and this supercritical $CO_2$ may be turned into a gas state as a result of expansion or temperature change that occurs afterwards. In the present specification, a member called a "line" can be a pipeline (pipe member).

The main supply line 32 is branched into a first supply line 34 and a second supply line 36 at a branch point 33. The first supply line 34 is connected to the first fluid supply 21 of the processing vessel 12. The second supply line 36 is connected to the second fluid supply 22 of the processing vessel 12.

A drain line 38 is connected to the fluid drain unit 24 of the processing vessel 12. The drain line 38 is provided with a pressure control valve 40. By adjusting an opening degree of the pressure control valve 40, a primary pressure of the pressure control valve 40 can be controlled, and, thus, an internal pressure of the processing vessel 12 can be adjusted.

A controller 100 schematically shown in FIG. 1 performs a feedback control over the opening degree of the pressure control valve 40 (specifically, a position of a valve body) based on a deviation between a measurement value PV and a set value SV of the internal pressure of the processing vessel 12 to maintain the internal pressure of the processing vessel 12 at the set value. For example, a detection value of a pressure sensor, which is assigned with a notation PS and disposed between the opening/closing valve V3 of the drain line 38 and the processing vessel 12, as shown in FIG. 1, may be used as the measurement value of the internal pressure of the processing vessel 12. That is, the interval pressure of the processing vessel 12 may be directly measured by a pressure sensor provided in the processing vessel 12, or indirectly measured by the pressure sensor PS which is provided outside the processing vessel 12 (in the drain line 38, for example).

The controller 100 is, for example, a computer, and includes an operation unit 101 and a storage 102. The storage 102 stores therein a program for controlling various kinds of processings performed in the supercritical processing apparatus (or the substrate processing system including the supercritical processing apparatus). The operation unit 101 controls the operation of the supercritical processing apparatus by reading and executing the program stored in the storage 102. The program may be recorded on a computer-readable recording medium and installed from this recording medium to the storage 102 of the controller 100. The computer-readable recording medium includes, by way of non-limiting example, a hard disk (HD), a flexible disk (FD), a compact disk (CD), a magnet optical disk (MO), a memory card, and the like.

At a branch point 42 set on the first supply line 34, a bypass line 44 is branched off from the first supply line 34. The bypass line 44 is connected to the drain line 38 at a connection point 46 set on the drain line 38. The connection point 46 is located upstream of the pressure control valve 40.

At a branch point 48 set on the drain line 38 upstream of the pressure control valve 40, a branch drain line 50 is branched from the drain line 38. A downstream end of the branch drain line 50 is, for example, opened to the atmospheric space at the outside of the supercritical processing apparatus, or connected to a factory exhaust duct.

At a branch point 52 set on the drain line 38, two branch drain lines 54 and 56 are branched off from the drain line 38. Downstream ends of the branch drain lines 54 and 56 join the drain line 38 again. A downstream end of the drain line 38 is connected to, for example, a fluid collecting device (not shown). A useful component (for example, IPA (isopropyl alcohol)) included in the $CO_2$ collected by the fluid collecting device is appropriately separated to be reused.

A purge gas supply line 62 is connected to a junction 60 set on the first supply line 34 between the branch point 42 and the processing vessel 12. A purge gas may be supplied into the processing vessel 12 via the purge gas supply line 62.

An exhaust line 66 is branched off from the branch point 64 set on the main supply line 32 immediately upstream of the branch point 33.

First Exemplary Embodiment of Drying Method

Now, a first exemplary embodiment of a drying method (substrate processing method) performed by using the above-described supercritical processing apparatus will be explained with reference to FIG. 2A to FIG. 2D and FIG. 3. The drying method to be described below is automatically performed based on a processing recipe and a control program stored in the storage 102, under the control of the controller 100.

In FIG. 2A to FIG. 2D, the opening/closing valves which are colored in black are in a closed state; and the opening/closing valves which are not colored, in an open state. In FIG. 2A to FIG. 2D, a line in which the $CO_2$ flows is indicated by a thick solid line, and a line in which the $CO_2$ stays at a certain pressure is indicated by a thick dashed line.

Figure 3:
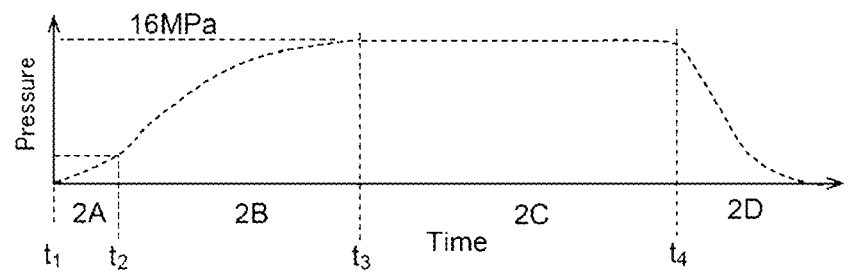
FIG. 3 is a graph showing an example of a pressure variation within a processing vessel in a period ranging from the pressure increasing process to the draining process.

In a graph of FIG. 3, a horizontal axis represents a time, and a vertical axis represents the internal pressure of the processing vessel 12. On the horizontal axis of the graph of FIG. 3, "2A" corresponds to a decelerated pressure increasing stage of a pressure increasing process; "2B," a normal pressure increasing stage of the pressure increasing process; "2C," a flowing process; and "2D," a draining process.

[Carry-In Process]

A substrate W, such as a semiconductor wafer, in which a recess of the pattern on the surface thereof is filled with IPA and a puddle of the IPA is formed on the surface thereof, is placed, by the non-illustrated substrate transfer arm or the like, on the plate 18 of the tray 14 which is standing by at the substrate transfer position. Further, on the substrate W, (1) a chemical liquid processing such as wet etching or chemical liquid cleaning, (2) a rinse processing in which the chemical liquid is washed away by a rinse liquid, and (3) an IPA replacement processing of replacing the rinse liquid with the IPA to form the puddle of the IPA are performed in sequence in a non-illustrated single sheet type cleaning apparatus. If the tray 14 having the substrate W placed thereon is moved to the processing position, a sealed processing space is formed within the processing vessel 12, and the substrate W is located within the processing space.

[Pressure Increasing Process]

Subsequently, the pressure increasing process is performed. This pressure increasing process includes the decelerated pressure increasing stage in an initial stage and the normal pressure increasing stage following the decelerated pressure increasing stage.

In addition, from a start time point of the pressure increasing process to an end time point of the draining process, the opening/closing valve V9 is always kept opened, whereas the opening/closing valves V10 and V11 are always kept closed. Thus, no more mention will be made about these opening/closing valves V9 to V11. Further, the opening/closing valve V8 may be always kept closed in the pressure increasing process and the flowing processes, and may be opened in the draining process. From the start time point of the pressure increasing process to the end time point of the draining process, the opening/closing valve V8 may be always kept closed, or it may be turned into an opened state at an appropriate timing when necessary. When the opening/closing V8 is opened, since a gas can be exhausted without passing through the pressure control valve 40, a time required for the gas exhaust or decompression can be shortened. In addition, the following description will be provided on the assumption that the opening/closing valve V8 is always closed.

<Decelerated Pressure Increasing Process>

Figure 2A:
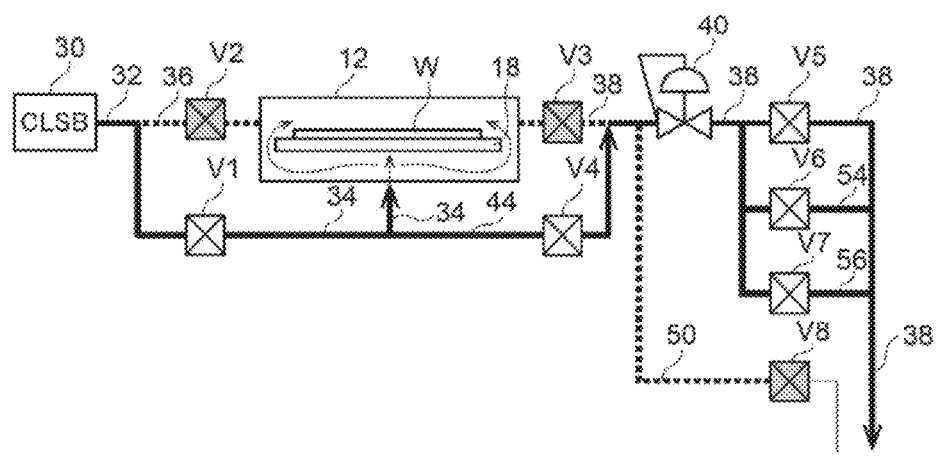
FIG. 2A is a schematic diagram for describing a decelerated pressure increasing stage of a pressure increasing process in a drying method according to a first exemplary embodiment.

First, as depicted in FIG. 2A, the opening/closing valves V2 and V3 are closed, whereas the opening/closing valves V1 and V4 to V7 are opened (a time point t1 in FIG. 3). In this decelerated pressure increasing process, the opening degree of the pressure control valve 40 may be fixed to, for example, an initial opening degree in the flowing process to be described later. The $CO_2$ supplied in the supercritical state from the supercritical fluid supply device 30 into the main supply line 32 flows into the first supply line 34, and a part of this $CO_2$ (for example, about 30% to 60%) is introduced into the processing vessel 12 through the first fluid supply 21. Further, the rest of the $CO_2$ having flown through the first supply line 34 does not head toward the processing vessel 12, but flows through the bypass line 44 to be introduced into the drain line 38, and then, is drained into the factory exhaust duct or collected and reused after flowing through the drain line 38.

Furthermore, by changing the opening degree of the pressure control valve 40, it is also possible to adjust a ratio between a flow rate of the $CO_2$ flowing into the processing vessel 12 and a flow rate of the $CO_2$ flowing through the bypass line 44. Thus, it does not matter even if the opening degree in the decelerated pressure increasing stage is different from the initial opening degree in the flowing process to be described later.

Immediately after the start of the decelerated pressure increasing stage, the pressure of the $CO_2$ supplied in the supercritical state from the supercritical fluid supply device 30 decreases greatly when it is introduced into the processing vessel 12 having a relatively large volume in the atmospheric pressure state. That is, in an initial stage of the introduction of the $CO_2$ into the processing vessel 12, the pressure of the $CO_2$ within the processing vessel 12 becomes lower than a threshold pressure (e.g., about 8 MPa), so that the $CO_2$ is turned into a gas state. Since a difference between an internal pressure of the first supply line 34 and the internal pressure of the processing vessel 12 in the atmospheric pressure state is very large, the $CO_2$ is introduced into the processing vessel 12 at a high flow velocity immediately after the start of the decelerated pressure increasing stage. If the $CO_2$ (especially, the high-velocity $CO_2$ in the gas state) collides with the substrate W or flows near the substrate W, a collapse (local evaporation or shaking) of the puddle of the IPA on a peripheral portion of the substrate W may occur, raising a risk of the pattern collapse.

In the present exemplary embodiment, since the orifice OLF is provided in the first supply line 34, the flow velocity of the $CO_2$ when it flows into the processing vessel 12 from the first fluid supply 21 becomes lower than a flow velocity thereof when there is provided no orifice. Therefore, the pattern collapse through the above-stated mechanism can be suppressed.

In addition, in the present exemplary embodiment, the $CO_2$ introduced into the processing vessel 12 from the first fluid supply 21 collides with the plate 18 of the tray 14, and then bypasses the plate 18 to enter the upper space 12A in which the substrate W is present (see arrows in FIG. 2A). Accordingly, by the time when the $CO_2$ in the gas state reaches the vicinity of the substrate W, the flow velocity of the $CO_2$ gets relatively low. For this reason, the pattern collapse by the above-described mechanism can be suppressed.

In addition, in the present exemplary embodiment, in the decelerated pressure increasing stage, that is, in the initial stage of the introduction of the $CO_2$ into the processing vessel 12, a part of the $CO_2$ flowing through the first supply line 34 is drawn out into the bypass line 44, so that the flow velocity of the $CO_2$ introduced into the processing vessel 12 from the first fluid supply 21 is further reduced. Thus, the pattern collapse by the above-stated mechanism can be suppressed more reliably.

If the flow velocity of the $CO_2$ flowing into the processing vessel 12 from the first fluid supply 21 is high, there may be a likelihood that the flow velocity of the $CO_2$ at a time point when it is introduced into the upper space 12A and reaches the vicinity of a periphery of the substrate W as indicated by arrows in FIG. 2A may be high enough to cause the pattern collapse by the above-described mechanism. In the present exemplary embodiment, in order to eliminate this possibility, the part of the $CO_2$ flowing through the first supply line 34 is drawn out into the bypass line 44, thus reducing the flow velocity of the $CO_2$ introduced into the processing vessel 12 from the first fluid supply 21.

It is only in the initial stage of the introduction of the $CO_2$ into the processing vessel 12 that the pattern collapse can occur due to the above-described mechanism. This is because the flow velocity of the $CO_2$ flowing into the processing vessel 12 through the first fluid supply 21 decreases with the increase of the internal pressure of the processing vessel 12. Therefore, it is sufficient to perform the decelerated pressure increasing stage for a relatively short time, for example, about 10 seconds to 20 seconds.

As an example of another advantage of this decelerated pressure increasing stage, it is not necessary to make a diameter of the orifice OLF of the first supply line 34 extremely small. Thus, when supplying the $CO_2$ from the first supply line 34 into the processing vessel 12, a pressure increasing time can be shortened.

<Normal Pressure Increasing Process>

Figure 2B:
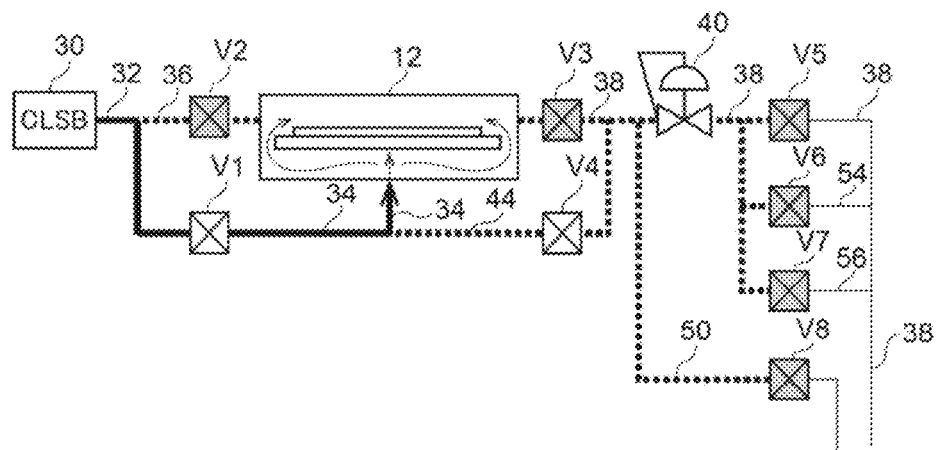
FIG. 2B is a schematic diagram for describing a normal pressure increasing stage of the pressure increasing process in the drying method according to the first exemplary embodiment.

Next, as shown in FIG. 2B, the opening/closing valves V5 to V7 are switched into the closed state (a time point t2 in FIG. 3). This switching may be performed, for example, when a detection value of the internal pressure of the processing vessel 12 exceeds a predetermined threshold. Alternatively, the switching may be performed upon a lapse of a preset time (for example, about 10 seconds as stated above) from the start of the decelerated pressure increasing stage. In this normal pressure increasing stage, it is desirable to fix the opening degree of the pressure control valve 40 to the initial opening degree in the flowing process to be described later for the purpose of smooth transition to the flowing process.

Along with the switching of the above-described opening/closing valves, the $CO_2$, which is introduced into the drain line 38 from the bypass line 44 to flow through the drain line 38 and the branch drain lines 54 and 56, is blocked by the opening/closing valves V5 to V7. In addition, the line 50 is also blocked by the opening/closing valve V8 which is closed. Accordingly, the $CO_2$ fills the lines 44, 38, 50, 54, and 56, and an internal pressure of the lines increases. As a result, a flow rate of the $CO_2$ flowing into the bypass line 44 from the first supply line 34 decreases, and the internal pressure of the processing vessel 12 is increased at a higher pressure increasing rate than that in the decelerated pressure increasing stage.

If the internal pressure of the processing vessel 12 exceeds the threshold pressure (about 8 MPa) of the $CO_2$, the $CO_2$ (which is not mixed with the IPA) present in the processing vessel 12 is turned into the supercritical state. If the $CO_2$ in the processing vessel 12 is turned into the supercritical state, the IPA on the substrate W begins to be dissolved in the $CO_2$ in the supercritical state.

After the internal pressure of the processing vessel 12 exceeds the threshold pressure of the $CO_2$, the above-stated normal pressure increasing stage is continued until the internal pressure of the processing vessel 12 reaches a pressure (supercritical state proof pressure) at which the $CO_2$ within the processing vessel 12 is guaranteed to be maintained in the supercritical state regardless of a temperature and a concentration of the IPA in a mixed fluid ($CO_2$+IPA) on the substrate W. The supercritical state proof pressure is approximately 16 MPa. If the internal pressure of the processing vessel 12 reaches the supercritical state proof pressure, the pattern collapse due to a local phase change (e.g., vaporization) of the mixed fluid within the surface of the substrate W does not occur anymore. Further, such a local phase change may occur due to non-uniformity of the IPA concentration in the mixed fluid within the surface of the substrate W, and, particularly, may occur in a region where the IPA concentration is of a value causing an increase of a threshold temperature.

[Flowing Process]

Figure 2C:
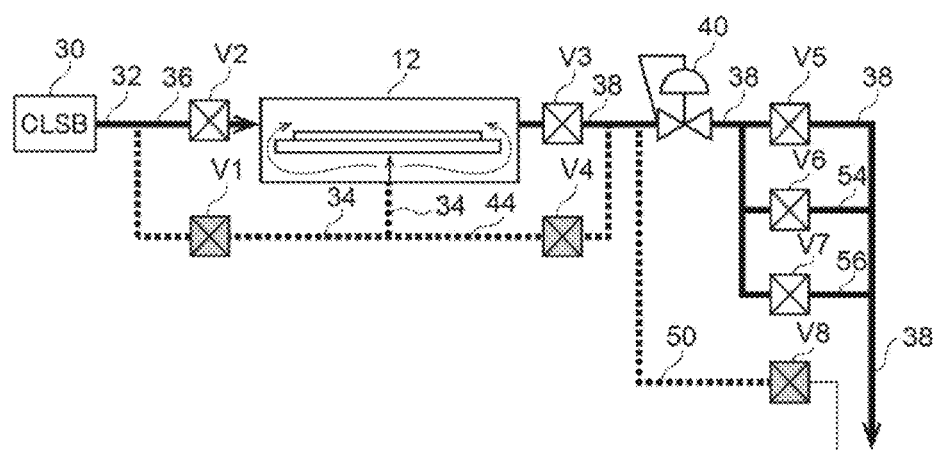
FIG. 2C is a schematic diagram for describing a flowing process in the drying method according to the first exemplary embodiment.

If it is confirmed by the pressure sensor that the internal pressure of the processing vessel 12 has reached the aforementioned supercritical state proof pressure, the opening/closing values V2, V3 and V5 to V7 are opened, whereas the opening/closing valves V1 and V4 are closed, as shown in FIG. 2C, and the control over the opening degree of the pressure control valve 40 is switched to a feedback control to proceed to the flowing process (a time point t3 in FIG. 3). Desirably, the opening of the opening/closing valves V5 to V7 may be performed at the same time as or slightly after the opening of the opening/closing valve V3.

Since the opening/closing valves V5 to V8 are kept closed until immediately before the switching of the opening/closing of the above-described opening/closing valves, the internal pressure of the lines 44, 38, 50, 54, and 56 is set to be substantially equal to the aforementioned supercritical state proof pressure. Further, the internal pressure of the first supply line 34 is also approximately equal to the aforementioned supercritical state proof pressure. Accordingly, a temporary decrease of the internal pressure of the processing vessel 12 immediately after the opening of the opening/closing valve V3 can be suppressed, so that a sharp change in the internal pressure of the processing vessel 12 before and after the switching of the above-described opening/closing valves can be avoided or greatly suppressed.

Figure 4A:
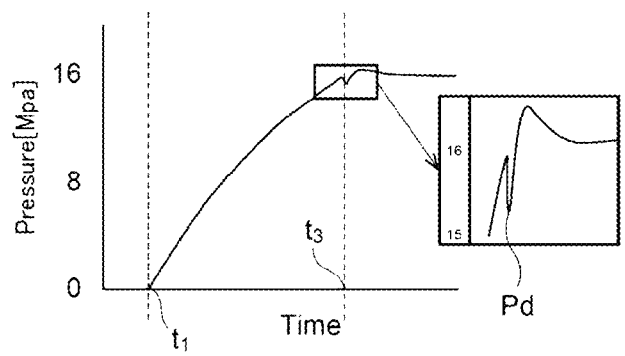
FIG. 4A is a graph illustrating a pressure variation within the processing vessel that may occur in transition from the pressure increasing process to the flowing process.
Figure 4B:
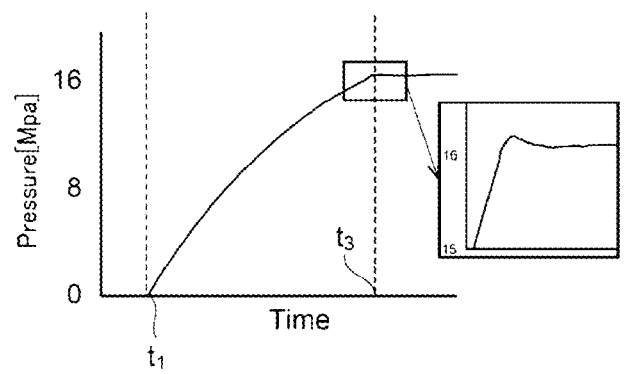
FIG. 4B is a graph illustrating a pressure variation within the processing vessel that may occur in transition from the pressure increasing process to the flowing process.

In addition, assuming that the internal pressure of the lines 44, 38, 50, 54 and 56 is, for example, the atmospheric pressure at a time point immediately before the switching of the opening/closing valves, a part of the $CO_2$ in the supercritical state within the processing vessel 12 immediately after the opening of the opening/closing valve V3 rapidly flows out into the lines 44, 38, 50, 54, and 56, resulting in a sharp drop of the internal pressure of the processing vessel 12 (for example, by about 1 MPa). This phenomenon is indicated by a notation Pd on a graph of FIG. 4A. In the present exemplary embodiment, however, this phenomenon does not occur, as can be clearly seen from a graph of FIG. 4B. In addition, if the internal pressure after such a pressure drop becomes smaller than the threshold pressure of the mixed fluid (CO2+IPA), there is a risk of the pattern collapse.

Further, if the internal pressure of the processing vessel 12 temporarily decreases as stated above, the internal pressure of the processing vessel 12 may be immediately increased by the feedback control, ending up with an overshoot causing the internal pressure to be higher than the set value. This is undesirable from the viewpoint of control stability. According to the present exemplary embodiment, however, such an overshoot does not occur or may be insignificant even if it does occur.

Until just before the start of the flowing process (until just before the feedback control is begun), the controller 100 sends an instruction maintaining the opening degree of the pressure control valve 40 to be the initial opening degree (which means the opening degree of the pressure control valve 40 that need to be achieved at the start of the flowing process (this meaning is applied to the following description as well)). The controller 100 switches the control over the opening degree of the pressure control valve 40 to the feedback control almost at the same time as the flowing process is begun. Accordingly, the opening degree of the pressure control valve 40 is controlled by the above-described feedback control based on the measurement value of the pressure sensor assigned with the notation PS.

The aforementioned initial opening degree may be defined as, for example, an opening degree of the pressure control valve 40 when the internal pressure of the processing vessel 12 is stabilized to be maintained at the set value (set pressure) (hereinafter, also referred to as "stabilized opening degree") in one cycle (or multiple cycles) of flowing process immediately before the current flowing process to be begun from that point. This stabilized opening degree may be an average value of valve opening degrees for the last preset period (for example, the last 10 seconds) of the flowing process, or may be an average value of valve opening degrees during the flowing process except immediately after the start of the flowing process. When using a new (never used) pressure control valve 40, the initial opening degree thereof may be decided based on a specification table provided by a manufacturer of the pressure control valve 40 or by an operation test.

By determining the initial opening degree of the pressure control valve 40 as described above, a fluctuation in the internal pressure of the processing vessel 12 at the time of starting the feedback control can be suppressed, so that the stabilized control can be carried out. If an inappropriate initial opening degree is set, the internal pressure of the processing vessel 12 may fluctuate immediately after the start of the feedback control, causing the control to be unstable (for example, hunting may occur). Moreover, by setting the initial opening degree of the pressure control valve 40 as stated above, the degradation of the pressure control valve 40 with a lapse of time can be appropriately coped with.

Figure 5:
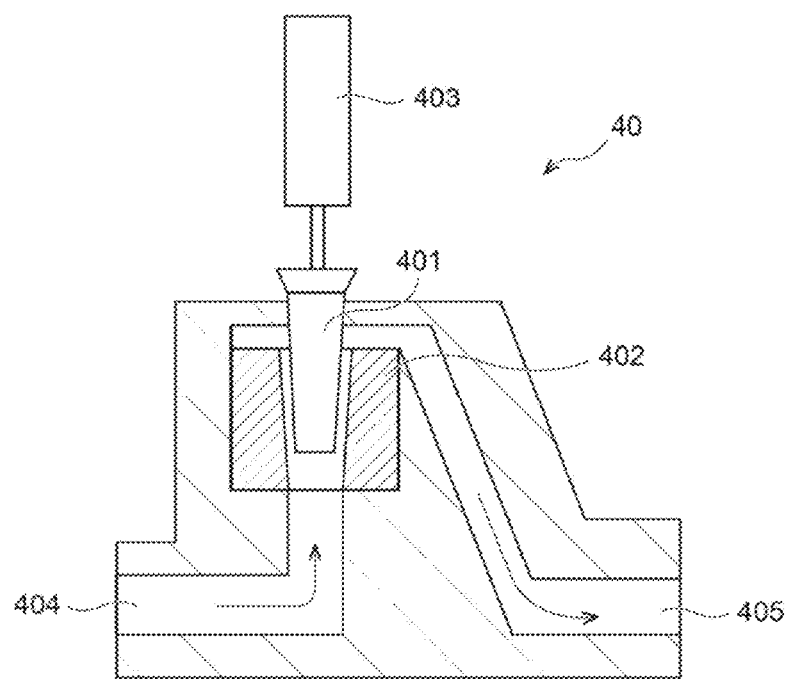
FIG. 5 is a schematic cross sectional view illustrating an example configuration of a pressure control valve.

Hereinafter, these advantages will be described in further detail. An example structure of the pressure control valve 40 is shown in FIG. 5. A tapered valve body 401 is inserted into a valve seat 402 which is complementary to the tapered valve body 401 and tapered to receive the tapered valve body 401. The opening degree of the pressure control valve 40 changes as an actuator 403 moves the valve body 401 up and down. If the valve body 401 is displaced upwards (downwards), a gap between an outer edge surface of the valve body 401 and an inner edge surface of the valve seat 402 becomes large (small), that is, the valve opening degree increases (decreases). If the valve opening degree increases (decreases), a flow of the $CO_2$ from an inlet port 404 to an outlet port 405 increases (decreases), resulting in a decrease (increase) of the internal pressure of the processing vessel 12 connected to the inlet port 404 via the drain line 38.

The controller 100 is configured to perform a feedback control of adjusting a position of the pressure control valve 40 by a certain distance (manipulation amount MV) based on the deviation between the measurement value PV and the set value SV of the internal pressure of the processing vessel 12 such that the internal pressure of the processing vessel 12 is maintained at the set value. For the purpose, the actuator 403 has a non-illustrated valve position sensor (which is a sensor for the manipulation amount MV) configured to detect the position of the valve body 401.

Surfaces of the valve body 401 and the valve seat 402 facing each other are worn out with a lapse of time as they are used. As their surfaces are worn away, an actual valve opening degree (a gap between the valve body and the valve seat) with respect to the same valve body position (a position in an up-and-down direction in the drawing) gradually increases. Thus, as for the pressure control valve 40 which has been used for a long time, if an instruction value for the initial opening degree (an instruction value for the valve body position) thereof at the start of the flowing process is set to be the same as that for the new pressure control valve 40, the actual initial opening degree (the gap between the valve body and the valve seat) of the pressure control valve 40 at the start of the flowing process becomes excessively large, which may cause the internal pressure of the processing vessel 12 to decrease temporarily immediately after the start of the feedback control. If this pressure reduction causes the internal pressure to fall below the aforementioned supercritical state proof pressure, there is a likelihood that the pattern collapse may occur. Also, there may arise a problem that the control over the internal pressure of the processing vessel 12 may not be stable immediately after the feedback control is begun.

In contrast, in the present exemplary embodiment, the position of the valve body 401 (the position detected by the valve position sensor) corresponding to the stabilized opening degree of the pressure control valve 40 in the flowing process which is performed in the relatively recent past, for example, just before the current flowing process) is stored, and this stored position of the valve body 401 is used as the initial position (initial opening degree) of the pressure control valve 40 in the current flowing process to be performed from that point. Thus, problems such as the pressure drop immediately after the start of the feedback control and the instability of the pressure control can be solved.

In the flowing process, the supercritical $CO_2$ supplied into the processing vessel 12 from the second fluid supply 22 flows through the region above the substrate, and then is drained from the fluid drain unit 24. At this time, a laminar flow of the supercritical $CO_2$ flowing substantially in parallel with the surface of the substrate W is formed in the processing vessel 12. The IPA in the mixed fluid (IPA+$CO_2$) on the surface of the substrate W exposed to the laminar flow of the supercritical $CO_2$ is replaced by the supercritical $CO_2$. Finally, almost all the IPA on the surface of the substrate W is replaced by the supercritical $CO_2$.

The mixed fluid composed of the IPA and the supercritical $CO_2$ drained from the fluid drain unit 24 is collected after flowing through the drain line 38 (and the branch drain lines 54 and 56). The IPA included in the mixed fluid can be separated and reused. In addition, in the flowing process, the opening/closing valve V6 and V7 may be either opened or closed depending on a required flow rate, or the like.

[Draining Process]

Figure 2D:
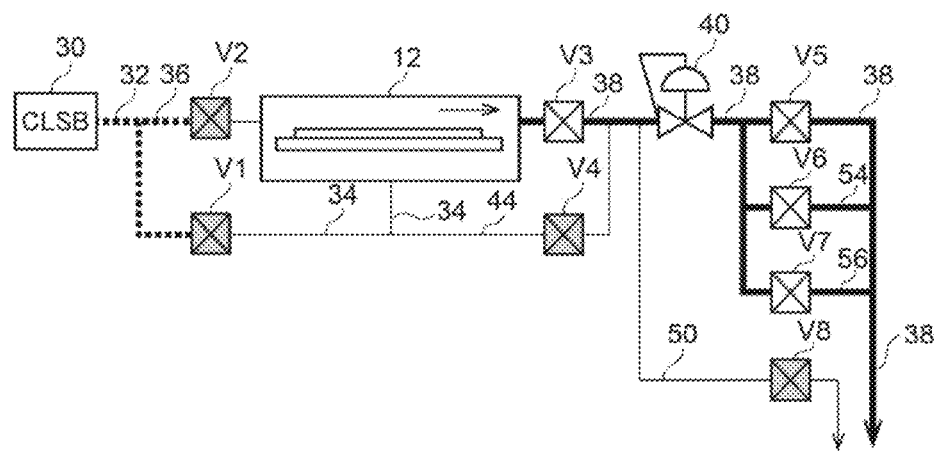
FIG. 2D is a schematic diagram for describing a draining process in the drying method according to the first exemplary embodiment.

Upon the completion of the replacement of the IPA with the supercritical $CO_2$, the opening/closing valve V2 is closed to stop the supply of the supercritical $CO_2$ into the processing vessel 12, as shown in FIG. 2D, and, further, the set pressure of the processing vessel 12 is lowered to the atmospheric pressure (a time point t4 in FIG. 3). At this time, the opening/closing valve V4 of the bypass line 44 may be opened. Accordingly, the opening degree of the pressure control valve 40 is greatly increased (for example, it is fully opened), and the internal pressure of the processing vessel 12 falls down to the atmospheric pressure. Along with this, the supercritical $CO_2$ present within the pattern of the substrate W is turned into a gas to be released from the pattern, and the $CO_2$ in this gas state is drained from the processing vessel 12. Instead of lowering the set pressure of the processing vessel 12 to the atmospheric pressure, an instruction signal for increasing the opening degree of the pressure control valve 40 may be sent to the pressure control valve 40 from the controller 100. In the draining process, the set pressure of the processing vessel 12 may be gradually lowered to the atmospheric pressure. Through these operations, the drying of the substrate W is completed.

[Carry-Out Process]

The plate 18 of the tray 14 on which the dried substrate W is placed is taken out of the processing vessel 12 and moved to the substrate transfer position. The substrate W is taken off the plate 18 by the non-illustrated substrate transfer arm, and is then accommodated in, for example, a non-illustrated substrate processing vessel.

Second Exemplary Embodiment of Drying Method

Now, a second exemplary embodiment of the drying method will be described with reference to FIG. 6A and FIG. 6B. Since the second exemplary embodiment is different from the first embodiment only in a pressure increasing process, only the pressure increasing process will be described. In the second exemplary embodiment, the exhaust line 66 and the opening/closing valve V10, which are not used in the first exemplary embodiment, are used. Moreover, in the pressure increasing process according to the second exemplary embodiment, the opening/closing valve V9 is always kept opened, and the opening/closing valve V11 is always kept closed, the same as in the first exemplary embodiment. In addition, it is assumed that the opening/closing valve V8 is always kept closed.

<Decelerated Pressure Increasing Stage>

Figure 6A:
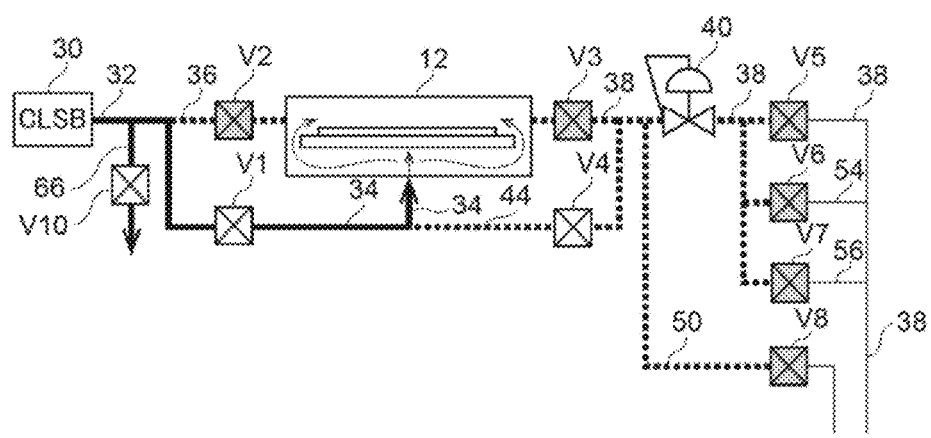
FIG. 6A is a schematic diagram for describing a decelerated pressure increasing stage of a pressure increasing process in a drying method according to a second exemplary embodiment.

In a decelerated pressure increasing stage, the opening/closing valves V2, V3 and V5 to V7 are closed, whereas the opening/closing valves V1, V4 and V10 are opened, as illustrated in FIG. 6A. In the decelerated pressure increasing stage, a part of the $CO_2$ in the supercritical state supplied from the supercritical fluid supply device 30 into the main supply line 32 flows into the exhaust line 66, and the rest of the $CO_2$ is introduced into the first supply line 34. The $CO_2$ introduced into the exhaust line 66 is either removed into the factory exhaust duct or collected to be reused. Since the part of the $CO_2$ having flown through the main supply line 32 is drawn out into the exhaust line 66, the flow rate of the $CO_2$ introduced into the first supply line 34 decreases. The exhaust line 66 is also called a 'draw-out line' in that it serves to draw out a surplus of the processing fluid for a required flow rate of the processing fluid to be introduced into the processing vessel 12 in the decelerated pressure increasing stage or a required pressure increasing rate of the processing vessel 12.

The $CO_2$ introduced into the first supply line 34 flows into the processing vessel 12 through the first fluid supply 21, and also flows into the bypass line 44. Since a part of the $CO_2$ flowing through the first supply line 34 is drawn out into the bypass line 44, the flow rate of the $CO_2$ flowing into the processing vessel 12 from the first supply line 34 is further reduced.

The $CO_2$ introduced into the bypass line 44 is blocked by the opening/closing valves V5 to V8 because the opening/closing valves V5 to V8 are closed. As a result, the lines 44, 38, 50, 54 and 56 are filled with the $CO_2$. Until the internal pressure of the lines 44, 38, 50, 54 and 56 increases, a part of the $CO_2$ introduced into the first supply line 34 flows out into the lines 38, 50, 54 and 56 through the bypass line 44. The internal pressure of the lines 44, 38, 50, 54 and 56 increases in a relatively short time, during which a part of the $CO_2$ introduced into the first supply line 34 flows out into the bypass line 44. Thus, in the initial stage of the decelerated pressure increasing stage, by drawing out a part of the $CO_2$ introduced into the first supply line 34 into the bypass line 44 in addition to the drawing-out of a part of the $CO_2$ having flown through the main supply line 32 into the exhaust line 66, the flow rate of the $CO_2$ flowing into the processing vessel 12 from the first supply line 34 can be suppressed considerably low. Even after the internal pressure of the lines 44, 38, 50, 54 and 56 is increased, since a part of the $CO_2$ having flown through the main supply line 32 is drawn out into the exhaust line 66, the flow rate of the $CO_2$ flowing into the processing vessel 12 is kept low (although it slightly increases actually). FIG. 6A shows a state after the internal pressure of the lines 44, 38, 50, 54 and 56 is increased.

<Normal Pressure Increasing Stage>

Figure 6B:
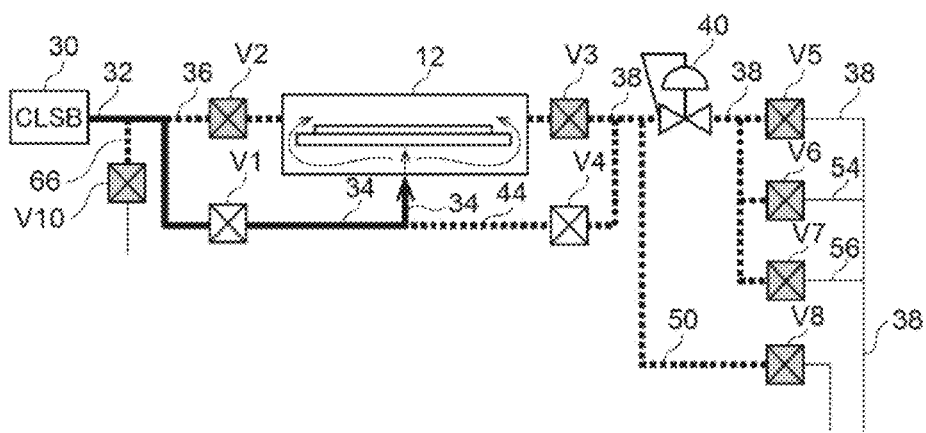
FIG. 6B is a schematic diagram for describing a normal pressure increasing stage of the pressure increasing process in the drying method according to the second exemplary embodiment.

Subsequently, as shown in FIG. 6B, the opening/closing valve V10 is closed so that the decelerated pressure increasing stage proceeds to the normal pressure increasing stage. As can be understood by comparing and contrasting FIG. 2B and FIG. 6B, the state of the flow/stay of the $CO_2$ in the normal pressure increasing stage in the second exemplary embodiment is the same as that in the normal pressure increasing stage in the first exemplary embodiment. In the second exemplary embodiment as well, the transition from the decelerated pressure increasing stage to the normal pressure increasing stage can be carried out when the detection value of the internal pressure of the processing vessel 12 exceeds a predetermined threshold, or when a predetermined time (for example, about 10 seconds as mentioned above) has elapsed from the start of the decelerated pressure increasing stage, for example. Transition from the normal pressure increasing stage to the flowing process can be performed in the same order as in the first exemplary embodiment. In the second exemplary embodiment, it is desirable to fix the opening degree of the pressure control valve 40 to the initial opening degree in the flowing process to be described later for smooth transition to the flowing process, the same as in the first exemplary embodiment.

Third Embodiment of Drying Method

Now, a third exemplary embodiment of the drying method will be described with reference to FIG. 7A, FIG. 7B and FIG. 7C. Since the third exemplary embodiment is different from the above-described first exemplary embodiment only in a pressure increasing process, only the pressure increasing process of the third exemplary embodiment will be explained. Also, in the third exemplary embodiment as well, the exhaust line 66 and the opening/closing valve V10, which are not used in the first exemplary embodiment, are used. Further, in the third exemplary embodiment as well, the opening/closing valve V9 is always kept opened and the opening/closing valve V11 is always kept closed in the pressure increasing process. In addition, it is assumed that the opening/closing valve V8 is always kept closed.

<Decelerated Pressure Increasing Stage>

Figure 7A:
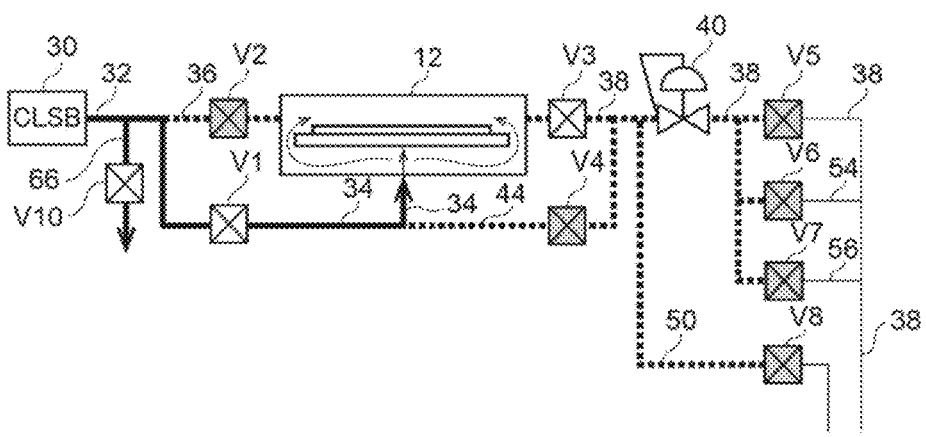
FIG. 7A is a schematic diagram for describing a decelerated pressure increasing stage of a pressure increasing process in a drying method according to a third exemplary embodiment.

In a decelerated pressure increasing stage, the opening/closing valves V4 to V7 are closed, whereas the opening/closing valves V1 to V3 and V10 are opened, as shown in FIG. 7A. In the decelerated pressure increasing stage, a part of the $CO_2$ in the supercritical state supplied from the supercritical fluid supply device 30 to the main supply line 32 flows into the exhaust line 66, while the rest of this $CO_2$ flows into the first supply line 34, the same as in the above-described second exemplary embodiment. The $CO_2$ introduced into the exhaust line 66 is either removed into the factory exhaust duct or collected to be reused. Since a part of the $CO_2$ having flown through the main supply line 32 is drawn out into the exhaust line 66, the flow rate of the $CO_2$ flowing into the processing vessel 12 after being introduced into the first supply line 34 is reduced. Thus, the flow rate of the $CO_2$ flowing into the processing vessel 12 from the first supply line 34 is suppressed considerably low, and the increase rate of the internal pressure of the processing vessel 12 is also suppressed low.

Since the opening/closing valve V3 is opened, the $CO_2$ introduced into the processing vessel 12 flows out into the drain line 38. Accordingly, particles floated by the $CO_2$ introduced into the processing vessel 12 in the initial stage of the decelerated pressure increasing stage are drained to the outside of the processing vessel 12. These particles have adhered to the inner wall surface of the processing vessel 12 or the surface of the tray 14. The $CO_2$ introduced into the drain line 38 is blocked by the opening/closing valves V5 to V8 which are closed. Further, since the opening/closing valve V4 is closed, the $CO_2$ is blocked on both sides of the opening/closing valve V4. As a result, the lines 44, 38, 50, 54 and 56 get filled with the $CO_2$. The internal pressure of the lines 44, 38, 50, 54 and 56 increases in a relatively short time.

Figure 7B:
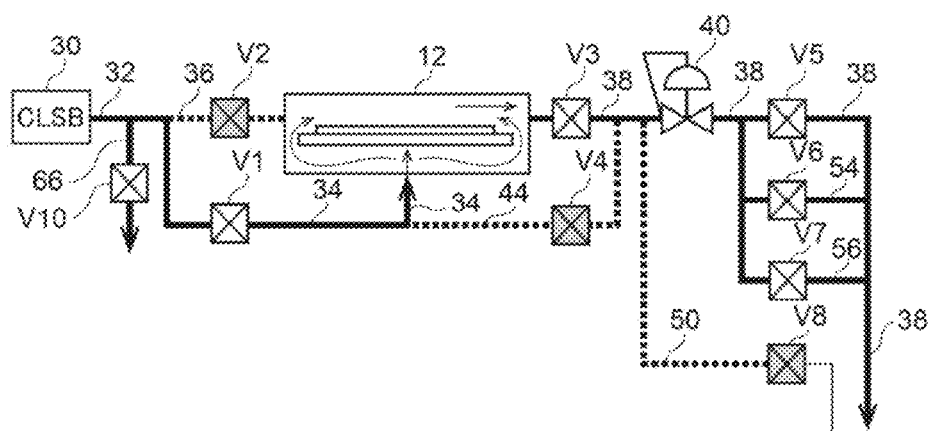
FIG. 7B is a schematic diagram for describing another example of the decelerated pressure increasing stage of the pressure increasing process in the drying method according to the third exemplary embodiment.

Further, as shown in FIG. 7B, at least one (all of) of the opening/closing V5 to V7 may be opened at least in the initial stage of the decelerated pressure increasing stage of the third exemplary embodiment, and the opening/closing valves V5 to V7 may be then closed. If at least one of the opening/closing valves V5 to V7 is opened, the $CO_2$ flows smoothly downstream through at least one of the lines 38, 54 and 56 (as compared to the case where all the opening/closing valves V5 to V7 are closed so that the lines 38, 54 and 56 are blocked), it is possible to accelerate the draining of the particles from the processing vessel 12 as described above. At least one of the opening/closing valves V5 to V7 may be opened during the whole period of the decelerated pressure increasing stage, and all of the opening/closing valves V5 to V7 may be closed at the moment the normal pressure increasing stage is begun. In this case, it is desirable to set the set pressure of the pressure control valve 40 to be as low as possible. By doing so, the $CO_2$ flowing out from the processing vessel 12 into the drain line 38 immediately after the start of the decelerated pressure increasing stage (at this time, the primary pressure of the pressure control valve 40 is low) is allowed to pass through the pressure control valve 40 easily.

<Normal Pressure Increasing Stage>

Figure 7C:
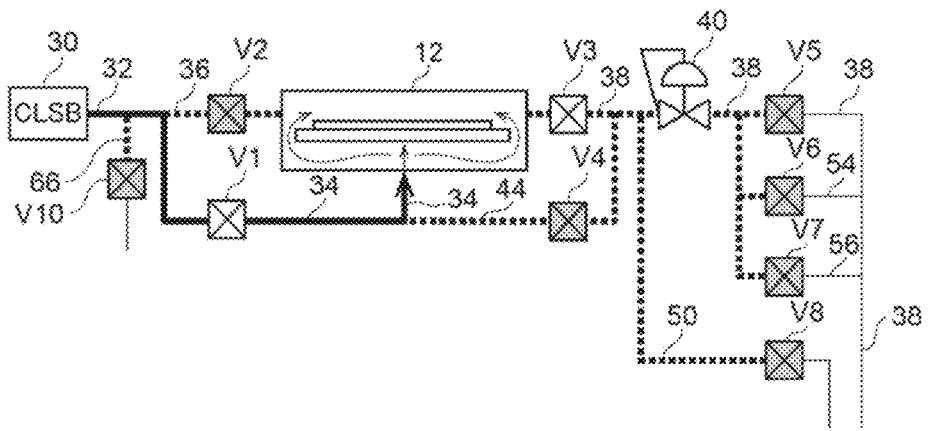
FIG. 7C is a schematic diagram for describing a normal pressure increasing stage of the pressure increasing process in the drying method according to the third exemplary embodiment.

Next, as shown in FIG. 7C, the opening/closing valves V3 and V10 are closed, and the decelerated pressure increasing stage proceeds to the normal pressure increasing stage. Further, as shown in FIG. 7B, if at least one of the opening/closing valves V5 to V7 is in the opened state at the end of the decelerated pressure increasing stage, the at least one of the opening/closing valves V5 to V7 in the opened state is closed. In the third exemplary embodiment as well, the transition from the decelerated pressure increasing stage to the normal pressure increasing stage may be performed when the detection value of the internal pressure of the processing vessel 12 exceeds a predetermined threshold value, or when a predetermined time (for example, about 10 seconds as mentioned above) has elapsed from the decelerated pressure increasing stage, for example. FIG. 7C is different from FIG. 2B in that the opening/closing valve V4 is closed, but it is the same as FIG. 2B in that the lines 44, 38, 50, 54 and 56 are filled with the high-pressure $CO_2$. Thus, by turning the opening/closing valve V1 into a closed state from the state shown in FIG. 7C and by opening the opening/closing valves V2 and V5 to V7, smooth transition from the normal pressure increasing stage (pressure increasing process) to the flowing process can be carried out. Also, in the third exemplary embodiment as well, it is desirable to fix the opening degree of the pressure control valve 40 to the initial opening degree in the flowing process to be described later for the purpose of the smooth transition to the flowing process, the same as in the first exemplary embodiment.

In addition, in the third exemplary embodiment, the bypass line 44 and the opening/closing valve V4 are not necessarily required, so the bypass line 44 and the opening/closing valve V4 may be omitted. Even without the bypass line 44, by drawing out a part of the $CO_2$ having flown through the main supply line 32 into the exhaust line 66 in the decelerated pressure increasing stage, it is still possible to suppress the pattern collapse.

It should be noted that the above-described exemplary embodiment is illustrative in all aspects and is not anyway limiting. The above-described exemplary embodiment may be omitted, replaced and modified in various ways without departing from the scope and the spirit of claims.

The substrate W as a processing target is not limited to the semiconductor wafer, and any of various other types of substrates for use in the manufacture of semiconductor devices, such as a glass substrate and a ceramic substrate, may be used.

In the above-described exemplary embodiments, the two fluid supplies 21 and 22 are provided in the processing vessel 12, and these two fluid supplies are used while being distinguished between the pressure increasing process and the flowing process. This configuration/operation is preferred for the reasons described above, but the present disclosure is not limited thereto. For example, only one fluid supply may be provided in the processing vessel 12, and both the pressure increasing process and the flowing process may be performed by supplying the processing fluid into the processing vessel through this single fluid supply. In this configuration as well, a bypass line may be provided in a supply line connected to the only one fluid supply, and a decelerated pressure increasing stage may be performed while drawing out a part of the processing fluid ($CO_2$) into a drain line via the bypass line.

Additionally, for the convenience of explanation in the present specification, the names of the supply lines are referred to as the "main supply line 32," the "first supply line 34," and the "second supply line 36" with the branch point 33 as a boundary. This naming is, however, for the convenience of explanation only, and the present disclosure is not limited to this interpretation. For example, the main supply line 32 and the first supply line 34 may be regarded as a series of (first) supply line (or main supply line) connecting the supercritical fluid supply device 30 and the processing vessel 12, and it may be deemed that the second supply line 36 branches off from the series of first supply lines 32+34 at the branch point 33. Other similar interpretations may also be possible. In particular, in the interpretation of the second and third exemplary embodiments, the above-mentioned point may be noted. Furthermore, in the second and third exemplary embodiments, the exhaust line 66, i.e., the draw-out line is not limited to being provided at the position shown in FIG. 1. By way of example, it may be connected to a branch point set between the branch point 33 and the branch point 42 of the first supply line 34.

According to the exemplary embodiment, it is possible to suppress the collapse of the pattern formed on the surface of the substrate more reliably.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to dry a substrate, which has a liquid on a surface thereof, with a processing fluid in a supercritical state, the substrate processing apparatus comprising:

a processing vessel configured to accommodate the substrate therein;

a substrate holder configured to hold the substrate horizontally within the processing vessel such that the surface of the substrate faces upwards;
a first supply line connected to a first fluid supply provided at the processing vessel and configured to supply the processing fluid into the processing vessel;
a drain line connected to a drain unit provided at the processing vessel and configured to drain the processing fluid from the processing vessel;
a bypass line branched off from the first supply line at a first branch point set on the first supply line and connected to the drain line at a connection point set on the drain line, the bypass line being configured to allow at least a part of the processing fluid flowing in the first supply line to be drained into the drain line without passing through the processing vessel;
a bypass opening/closing valve configured to open or close the bypass line;
a pressure control valve provided in the drain line and configured to adjust an internal pressure of the processing vessel; and
a controller configured to control an operation of the substrate processing apparatus,
wherein the connection point at which the bypass line is connected to the drain line is set between the processing vessel and the pressure control valve, and
when increasing the internal pressure of the processing vessel by the processing fluid supplied into the processing vessel from the first supply line, the controller opens the bypass opening/closing valve to drain a part of the processing fluid flowing in the first supply line into the drain line through the bypass line, and
the first fluid supply provided at the processing vessel is configured to supply the processing fluid into the processing vessel toward a bottom surface of the substrate holder configured to hold the substrate,
the processing vessel is further provided with a second fluid supply configured to supply the processing fluid in a direction approximately along the surface of the substrate toward a space above the substrate held by the substrate holder, and
wherein the substrate processing apparatus further comprises:
a main supply line connected to a processing fluid source configured to supply the processing fluid in the supercritical state, the main supply line being branched off into the first supply line and a second supply line at a second branch point set on the main supply line, and the second supply line being connected to the second fluid supply;
a first opening/closing valve provided between the second branch point and the first branch point;
a second opening/closing valve provided between the second branch point and the second fluid supply; and
a third opening/closing valve provided between the drain unit and the connection point.

2. The substrate processing apparatus of claim 1, further comprising:
a controller configured to control an operation of the substrate processing apparatus,
wherein the controller increases, in a first period, the internal pressure of the processing vessel up to a pressure equal to or higher than a threshold pressure of the processing fluid by the processing fluid supplied into the processing vessel from the first supply line, in a first state in which the first opening/closing valve and the bypass opening/closing valve are opened, whereas the second opening/closing valve and the third opening/closing valve are closed, and
the controller allows, in a second period following the first period, the processing fluid to be supplied into the processing vessel from the second supply line and the processing fluid to be drained from the drain unit while maintaining the internal pressure of the processing vessel at the pressure equal to or higher than the threshold pressure of the processing fluid, in a second state in which the second opening/closing valve and the third opening/closing valve are opened, whereas the first opening/closing valve and the bypass opening/closing valve are closed.

3. The substrate processing apparatus of claim 2, further comprising:
one or more fourth opening/closing valves provided in the drain line downstream of the pressure control valve,
wherein the controller closes the one or more fourth opening/closing valves at least at an end time point of the first period and the controller fills at least a portion of the drain line ranging from the third opening/closing valve to the one or more fourth opening/closing valves with the processing fluid introduced into the portion from the bypass line to thereby increase an internal pressure of the portion.

4. The substrate processing apparatus of claim 3,
wherein the controller opens the one or more fourth opening/closing valves at least in an initial stage of the first period to allow the processing fluid introduced into the drain line from the bypass line to flow downstream of the one or more fourth opening/closing valves in the drain line.

5. The substrate processing apparatus of claim 2, further comprising:
a pressure sensor configured to directly or indirectly detect the internal pressure of the processing vessel,
wherein the controller is configured to perform, in the second period, a feedback control over an opening degree of the pressure control valve such that the internal pressure of the processing vessel is a set value based on a deviation between the set value of the internal pressure of the processing vessel and a pressure measurement value by the pressure sensor.

6. The substrate processing apparatus of claim 5,
wherein the feedback control over the opening degree of the pressure control valve is performed based on the deviation by adjusting a position of a valve body of the pressure control valve with an actuator such that the internal pressure of the processing vessel is the set value, and
the controller sets an initial position of the valve body of the pressure control valve at a start of the feedback control to a position of the valve body of the pressure control valve at a time when the opening degree of the pressure control valve is stable in the second period in a substrate processing performed previously.

7. The substrate processing apparatus of claim 6,
wherein the substrate processing performed previously is a substrate processing performed immediately before a substrate processing currently being performed.

8. The substrate processing apparatus of claim 1, further comprising:
a draw-out line branched off from the first supply line at a branch point set on the first supply line upstream of the first branch point; and
an opening/closing valve provided in the draw-out line, wherein when increasing the internal pressure of the processing vessel by the processing fluid supplied into the processing vessel from the first supply line, the controller opens the opening/closing valve of the draw-out line to drain a part of the processing fluid flowing in the first supply line.

9. The substrate processing apparatus of claim 1, further comprising:
a draw-out line branched off from the first supply line at a branch point set on the first supply line; and
an opening/closing valve provided in the draw-out line;
wherein when increasing the internal pressure of the processing vessel by the processing fluid supplied into the processing vessel from the first supply line, the controller opens the opening/closing valve of the draw-out line to drain a part of the processing fluid flowing in the first supply line toward the processing vessel into the draw-out line.

10. The substrate processing apparatus of claim 9, further comprising:
an opening/closing valve provided in the drain line upstream of the pressure control valve,
wherein when increasing the internal pressure of the processing vessel by the processing fluid supplied into the processing vessel from the first supply line, the controller opens the opening/closing valve of the drain line, and, in this state, the controller supplies the processing fluid into the processing vessel from the first supply line while draining a part of the processing fluid flowing in the first supply line toward the processing vessel into the draw-out line.

11. The substrate processing apparatus of claim 10, further comprising:
an opening/closing valve provided in the drain line downstream of the pressure control valve,
wherein when increasing the internal pressure of the processing vessel by the processing fluid supplied into the processing vessel from the first supply line, the controller opens the opening/closing valve provided in the drain line downstream of the pressure control valve and lowers a set pressure of the pressure control valve to thereby allow the processing fluid drained into the drain line from the processing vessel to flow downwards of the pressure control valve and the opening/closing valve provided downstream of the pressure control valve.

12. A substrate processing method of drying a substrate, which has a liquid on a surface thereof, with a processing fluid in a supercritical state by using a substrate processing apparatus as claimed in claim 1, the substrate processing method comprising:
increasing the internal pressure of the processing vessel by introducing the processing fluid into the processing vessel from the first supply line,
wherein the increasing of the internal pressure of the processing vessel is performed while draining a part of the processing fluid flowing in the first supply line into the drain line through the bypass line without passing through the processing vessel.

* * * * *